United States Patent [19]

Mok et al.

[11] Patent Number: 5,704,117
[45] Date of Patent: Jan. 6, 1998

[54] METHOD OF ASSEMBLING AN EMI SHIELD AROUND AN ELECTRONIC COMPONENT

[75] Inventors: Henry W.C. Mok, Kanata; Kevin J. Bailey; Paul A. Lindsay, both of Ottawa; Robert C. Sheffield, North Gower; Michal S. Tencer, Nepean, all of Canada

[73] Assignee: Northern Telecom Limited, Montreal, Canada

[21] Appl. No.: 662,966

[22] Filed: Jun. 13, 1996

Related U.S. Application Data

[62] Division of Ser. No. 489,065, Jun. 9, 1995, abandoned.

[51] Int. Cl.$^6$ .................................................. H05K 3/30
[52] U.S. Cl. ................................... 29/841; 174/35 R
[58] Field of Search ................... 29/840, 841; 174/35 R

[56] References Cited

U.S. PATENT DOCUMENTS

| | | |
|---|---|---|
| 4,967,311 | 10/1990 | Ferchau et al. . |
| 5,014,160 | 5/1991 | McCoy, Jr. . |
| 5,323,298 | 6/1994 | Shatas et al. . |
| 5,323,299 | 6/1994 | Weber . |
| 5,335,147 | 8/1994 | Weber . |
| 5,354,951 | 10/1994 | Lange, Sr. et al. . |

*Primary Examiner*—Carl J. Arbes
*Attorney, Agent, or Firm*—R. J. Austin

[57] ABSTRACT

An EMI shield for a component mounted upon a printed circuit board. The shield is an open sided box made from plastic insulating material supporting an electrically conductive shield layer. A surrounding flange is provided by the plastic at the open side of the box, the flange having a surface facing outwards in the same direction as the open side. The conductive shield layer extends onto the outward facing surface.

2 Claims, 3 Drawing Sheets

METHOD OF ASSEMBLING AN EMI SHIELD AROUND AN ELECTRONIC COMPONENT

This is a division of Pat. application Ser. No. 08/489,065, filed on Jun. 9, 1995 by H. W. C. Mok, et al for "EMI Shield" now abandoned.

This invention relates to EMI shields.

Electromagnetic radiation is emitted by electronic components mounted upon printed circuit boards and unless shielding is provided, this radiation acts as electromagnetic interference (EMI) and may affect the operation of other components on the boards or other electrical equipment spaced from the board. To minimize the interference problems, EMI shields are designed for location around specific electronic components mounted upon printed circuit boards.

Conventional EMI shields provided for the above purpose are of box structure to fit over and enclose, with clearance, the specific electronic components for which shielding is necessary, each box structure being formed from an electrically conductive metal sheet. Each box structure has an open side for fitting over the associated component and a surrounding flange is provided which has spaced-apart pins for location in registration holes in the board. A soldering process is necessary to solder the flange and the pins to the board, both for supporting the weight of the shield and also for providing grounding for the shield. The pins are located a short distance apart around the flange and the locations of the registration holes in the printed circuit board restrict design freedom for passage of circuitry to the electronic component which is being shielded. This increases the difficulty in making and the cost of the design of the board inordinately beyond that which would prevail if shielding was unnecessary. Functional testing of circuitry and components on a printed circuit board does not require EMI shields to be assembled onto the board. However, the method of assembly of a conventional shield onto a printed circuit board, i.e. by soldering, which must be performed during soldering of other components onto the board, ensures that functional testing of the circuitry of the board and of the board components cannot be commenced until after the or each shield is properly secured to the board. In the event that an electronic component is found to be malfunctioning or inoperative during testing, it is then a very difficult task to remove a surrounding EMI shield to allow access to the component and such removal potentially may result in damage to circuitry or other components on the board.

The present invention seeks to provide an EMI shield and a method of fitting an EMI shield onto a printed circuit board which avoids or minimizes the above problems.

Accordingly, the present invention provides an EMI shield comprising a box of an electrically insulating material having wall means with free ends defining an open side to the box, the free ends provided with flange means extending at an angle to the wall means and surrounding the open side of the box with the surface of the flange means facing outwardly in the same direction as the open side, the box formed from plastic material and having an inner surface and an outer surface and carrying on at least one of the inner and the outer surfaces, an electrically conductive shield layer, the conductive covering layer extending onto the outwardly facing surface of the flange means.

The shield according to the invention is capable of having a light structural weight and may be secured conveniently by means other than by soldering, to the surface of a printed circuit board so long as the shield is connected to ground. As a result, a shield of the invention need not be mounted upon a printed circuit board until after the printed circuit board has been functionally tested whereby mounting of the shield is performed only after proper functional operation has been ensured of the electronic component which is to be shielded. In a preferred construction, the shield box has been made by thermoforming from plastic sheet and advantageously the thermoformed box has a maximum thickness of 0.03 inches and preferably has a thickness between 0.01 and 0.02 inches. The box may therefore be in the form of a plastic film and a suitable material for this purpose is polycarbonate film although other suitable plastics materials are available. After the box has been thermoformed then the conductive shield layer is subsequently added. This shield layer may be added by an electroless nickel plating process, a silver plated copper painting process, a tin/zinc arc spraying process, or an aluminum vacuum metallizing process. A shield layer may be provided on both the inner and outer surfaces of the box.

The invention also includes a method of making an EMI shield comprising thermoforming a plastic box with an inner surface and an outer surface, the box having wall means with free ends of the wall means defining an open side to the box, the free ends having flange means extending at an angle to the wall means and surrounding the open side of the box with a surface of the flange means facing outwardly in the same direction as the open side; and coating at least one of the inner and outer surfaces with an electrically conductive shield layer which extends onto the outwardly facing surface of the flange means.

The invention further includes a method of assembling an EMI shield around an electronic component comprising: providing a substrate having one side carrying the component and a ground line on the side of the substrate carrying the component; providing the EMI shield of a construction comprising a box of a polymeric insulating material having wall means with free ends of the wall means defining an open side to the box, the free ends provided with flange means extending at an angle to the wall means and surrounding the open side of the box with a surface of the flange means facing outwardly in the same direction as the open side, the box having an inner surface and an outer surface and carrying on at least one of the inner and outer surfaces an electrically conductive shield layer extending to the outwardly facing surface of the flange means; and locating the EMI shield upon the substrate in a desired position surrounding the component, by guiding the shield into position with at least two alignment pins extending through alignment holes in the substrate and in the flange of the shield, and securing the flange to the ground line with an electrically conductive adhesive to electrically connect the shield layer to the ground line.

In the method according to the last preceding paragraph the alignment pins may possibly be provided as an integral part of the substrate. However, in a more convenient method of manufacture a jig is provided which comprises the alignment pins and the substrate is disposed upon the jig with the pins extending through the alignment holes in the substrate. The shield is then located in place and the alignment holes in the flange of the shield accept the alignment pins for shield location purposes. After securing the shield to the substrate, this assembly is then separated from the jig accompanied by removal of the alignment pins out from the alignment holes of both substrate and shield.

One embodiment of the invention will now be described, by way of example, with reference to the accompanying drawings, in which.

Figure 1:
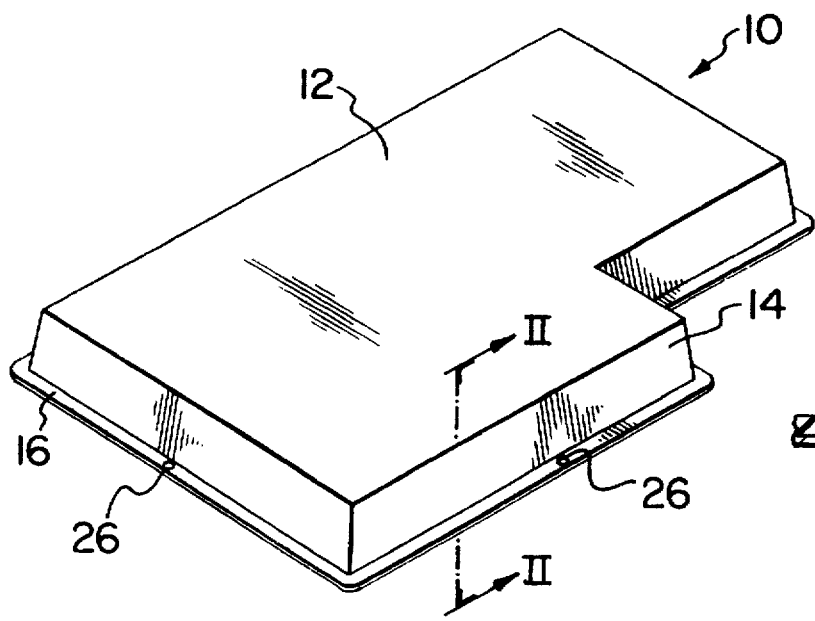
FIG. 1 is an isometric view looking at the top of an EMI shield according to the embodiment.
Figure 2:
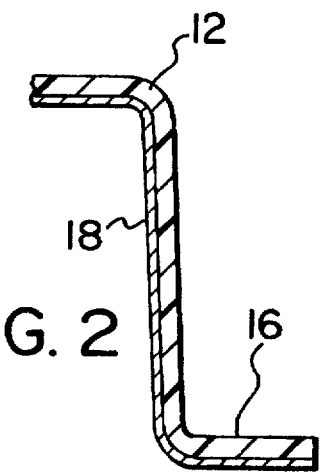
FIG. 2 is a cross-sectional view taken along line II—II in FIG. 1 and to a larger scale.
Figure 3:
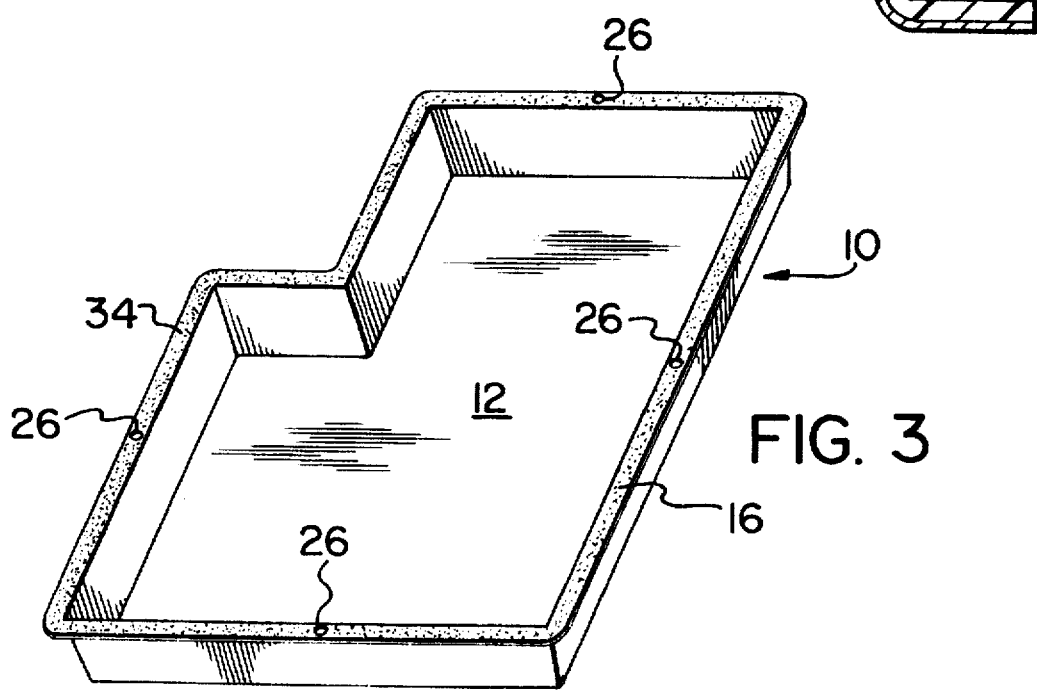
FIG. 3 is an underside isometric view of the EMI shield.

In the embodiment as shown in FIGS. 1, 2 and 3, an EMI shield 10 comprises a thermoformed plastic box 12 (FIG. 2) with a maximum thickness of 0.02 inches and made from suitable thermoforming material such as polycarbonate film. As shown by FIGS. 1 to 3, the box 12 is open-sided underneath (see particularly FIG. 3) and the side walls 14 of the box are formed with flange means in the form of a continuous surrounding flange 16. After formation of the box 12 it is covered on the inner surface with a conductive EMI shielding layer 18 applied by a silver plated copper coating. Layer 18 extends as shown by FIG. 2, onto the lower surface of the flange 16, i.e. the surface of the flange facing in the same direction as the open side of the box.

Figure 4:
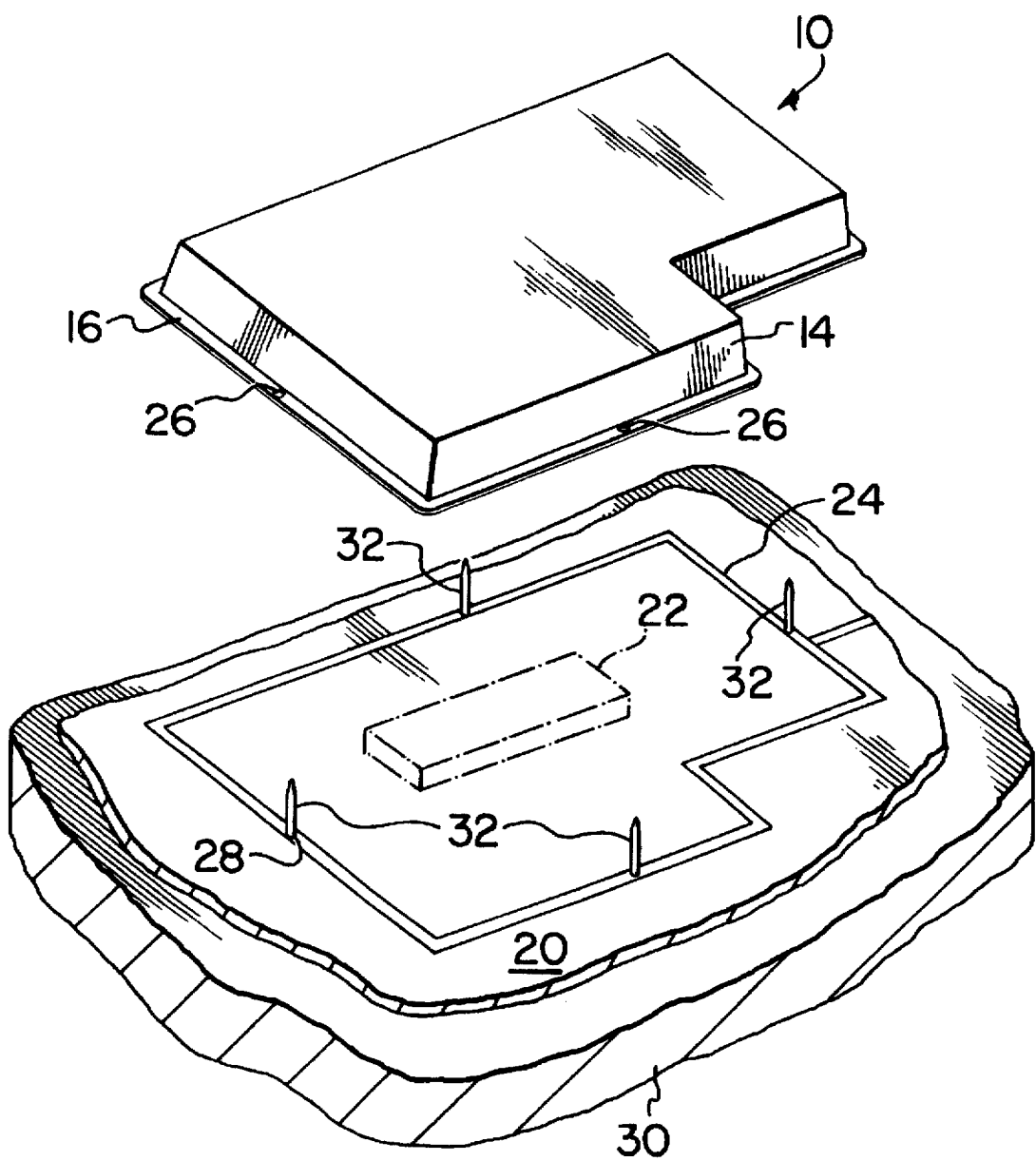
FIG. 4 is a view similar to FIG. 1 and showing the EMI shield at a first stage in its assembly onto a printed circuit board for surrounding an electronic component.

The EMI shield is to be assembled onto a substrate in the form of a printed circuit board 20 (FIG. 4) so as to surround and electromagnetically shield an electronic component 22 shown in chain-dotted outline in FIG. 4. The printed circuit board is suitably prepared for the fitting of the shield onto the surface carrying the component 22 by having been previously prepared with a ground line 24 surrounding the component 22, the ground line being formed during the manufacture of the board from a deposit of copper and having a shape in plan view such that when the shield is fitted in a desired position to the board 20, the under surface of the flange 16 is directly opposed to the ground line 24 completely around the flange 16.

Figure 5:
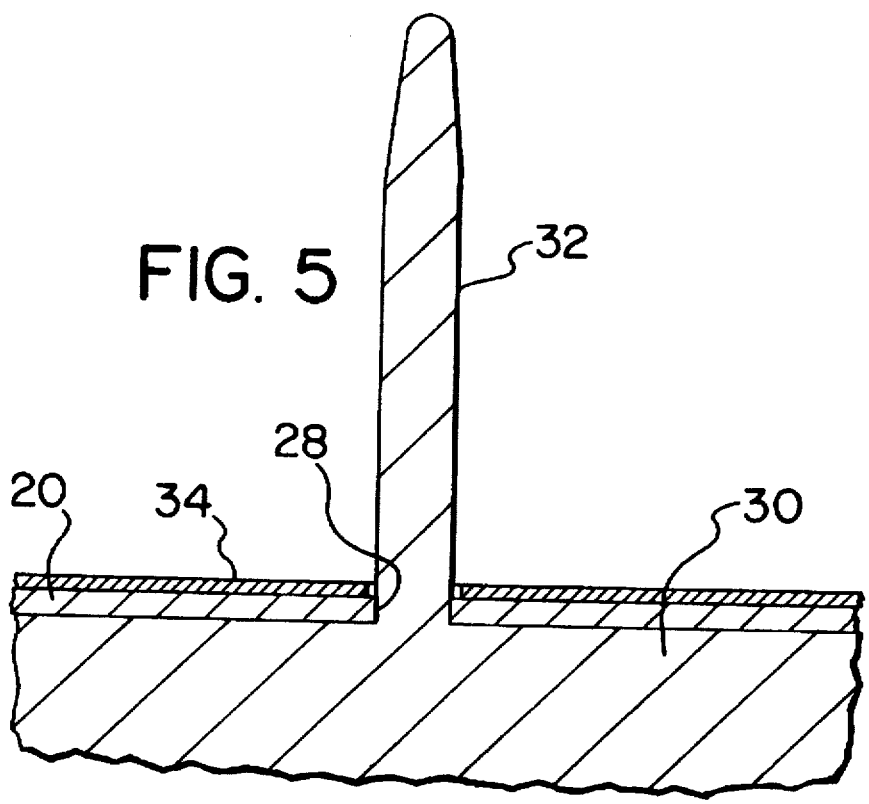
FIG. 5 is a cross-sectional view to a much enlarged scale taken along line V—V in FIG. 4 directly after manufacture of the finished assembly.
Figure 6:
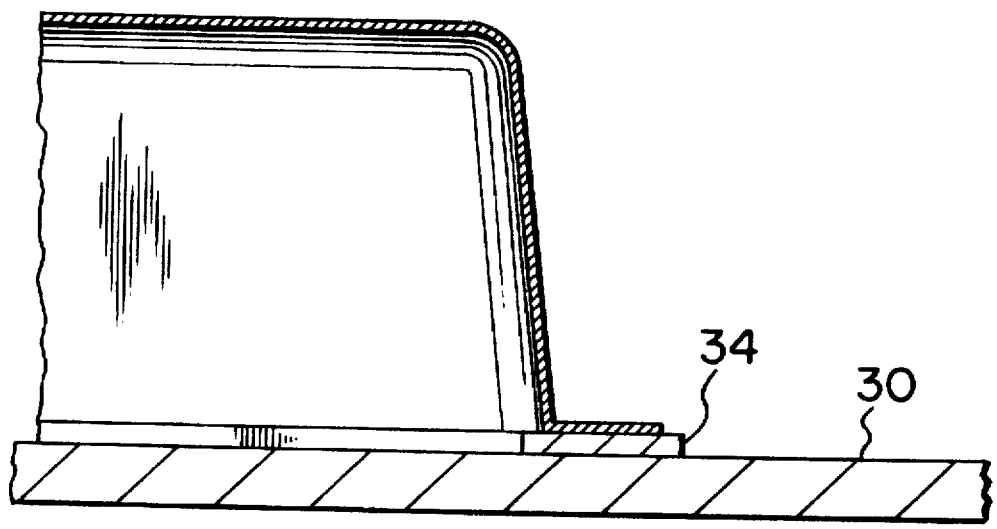
FIG. 6 is a cross-sectional view similar to FIG. 2, on a larger scale, and showing the finished assembly.

To complete the assembly of the shield onto the board, the shield is formed during manufacture with a plurality (namely four in this embodiment) of alignment holes 26 positioned in spaced-apart locations around the flange 16. Only two of the holes 26 are shown in FIGS. 1 and 4, the other two holes being obscured by the top of the box 12. The printed circuit board is similarly formed with four alignment holes 28 (see FIGS. 4 and 5) and these alignment holes will be aligned with the holes 26 in the shield when this is correctly fitted to the printed circuit board. To align the holes 26 with the holes 28, a special jig 30 (FIGS. 4 to 6 is provided). The jig 30 is a solid metal jig and has four alignment pins 32 extending upwardly and positioned in such locations as to pass simultaneously through each of the holes 28. The jig is built for vertical up and down movement, by any suitable means such as pneumatic means.

To assemble the shield 10 to the printed circuit board 20, it is necessary to provide adherence between the flange 16 and the ground line 24 on the printed circuit board. For this purpose, a conductive bonding material is required and conveniently, in this embodiment, this bonding material is in the form of a conductive adhesive transfer tape 34 sold under the trade name "ARCLAD" 8001. As shown by FIG. 3 this particular tape is attached by one of its major surfaces to the underside of the flange 16 so that it lies in contact with the conductive layer 18. The shield 10 is then assembled onto the board 20 by placing the board upon the jig 30 so that each of the alignment pins 32 passes through an associated alignment hole 28, the shield being then located with the alignment pins passing through the holes 26 and the shield pressed down onto the board 20. As may be seen, this procedure results in the adhesive tape 34 adhering also the ground line 24 on the printed circuit board and as shown particularly in FIG. 6. The jig 30 together with the alignment pins 32 is then removed from the finished assembly.

It is found that with an adhesive conductive material used in the way described in the embodiment, that it is sufficient to hold the EMI shield permanently in a correct position upon a printed circuit board so as to offer continuous EMI protection for an electronic component such as item 22 upon the board. The EMI shield is extremely light in weight when made by a thermoforming process and having a thin conductive shield layer applied to it on one or both of its surfaces for contact with the ground line on the board. The adhesive such as the "ARCLAD" adhesive transfer tape 34 has sufficient strength for the permanent attachment for the shield to the board.

The use of such a lightweight shield and the process of assembly onto the board, simplifies both the design and manufacture of circuitry of the board in that a large number of apertures passing through the board for attachment of much heavier EMI shields are not required. In addition, because of the method of attachment of the shield to the board in the invention, soldering, which is conventional EMI shield practice procedure, is avoided together with the necessity of adding conventional shields before functional testing of a finished circuit board can take place. In contrast, shields such as shield 10 are not added to the board until the correct functionality of the entire board has been determined so that should replacement parts be necessary, then the difficult practice of removing previously soldered EMI shields from boards is avoided together with loss of time and cost.

What is claimed is:

1. A method of assembling an EMI shield around an electronic component comprising:

providing a substrate having one side carrying the component and a ground line on the side of the substrate carrying the component;

providing the EMI shield of a construction comprising a box of a plastic insulating material having wall means with free ends defining an open side to the box, the free ends provided with flange means extending at an angle to the wall means and surrounding the open side of the box with a surface of the flange means facing outwardly in the same direction as the open side, the box having an inner surface and an outer surface and carrying upon at least one of the inner and outer surfaces an electrically conductive shield layer extending to the outwardly facing surface of the flange means;

and locating the EMI shield upon the substrate in a desired position surrounding the component by guiding the shield into position with at least two alignment pins extending through alignment holes in the substrate and in the flange of the shield and securing the flange to the ground line with an electrically conductive adhesive to electrically connect the shield layer to the ground line.

2. A method according to claim 1, wherein the shield is assembled to the substrate by disposing the substrate upon a jig which is provided with the alignment pins so that the alignment pins extend through the alignment holes in the substrate, and then moving the shield onto the substrate so that the pins pass through the alignment holes in the shield and with the pins continuously in the alignment holes of both substrate and shield, pressing the shield to the substrate so that the adhesive is sandwiched between the flange means and the substrate and causes the flange means to bond to the substrate, the assembly then being separated from the jig accompanied by removal of the alignment pins from the aligned holes in both shield and substrate.

* * * * *